United States Patent [19]
Niijima et al.

[11] Patent Number: 5,825,191
[45] Date of Patent: Oct. 20, 1998

[54] IC FAULT LOCATION TRACING APPARATUS AND METHOD

[75] Inventors: Hironobu Niijima, Ohizumi-machi; Hiroaki Kobayashi, Kumagaya, both of Japan

[73] Assignee: Advantest Corp., Tokyo, Japan

[21] Appl. No.: 617,316

[22] Filed: Mar. 18, 1996

[30] Foreign Application Priority Data

Mar. 16, 1995 [JP] Japan ................................ 7-84798

[51] Int. Cl.⁶ ................. G01R 31/305; G01R 31/28
[52] U.S. Cl. ............................. 324/751; 324/765
[58] Field of Search ............................ 324/751, 750, 324/500, 501, 765; 250/310, 311; 371/25.1

[56] References Cited

U.S. PATENT DOCUMENTS

| | | | |
|---|---|---|---|
| 5,640,098 | 6/1997 | Niijima et al. | 324/751 |
| 5,682,104 | 10/1997 | Shido | 324/751 |
| 5,703,492 | 12/1997 | Nakamura et al. | 324/751 |

*Primary Examiner*—Ernest F. Karlsen
*Attorney, Agent, or Firm*—Muramatsu & Associates

[57] ABSTRACT

The present invention is to provide an IC fault location tracing apparatus with which a user having any knowledge of the DUT design is easily able to identify the IC fault location in a short period of time. The IC fault location tracing apparatus of the present invention includes a control device instructing visual field data to the charged particle ray tester and capturing different images of said electric potential contrast images from the charged particle ray tester, wherein said control device further includes: a fault-suspected layout pattern/net recognition means; a n output gate recognition means for fault-suspected layout patterns; an input net polygon recognition means corresponding to input net of the output gate of the fault-suspected layout pattern; a visual field determination means determining next visual field data for tracing fault location; a layout (visual field) display means instructing next layout (visual field) data to the charged particle ray tester; a memory device storing net layout corresponding information and device-layout corresponding information.

10 Claims, 2 Drawing Sheets

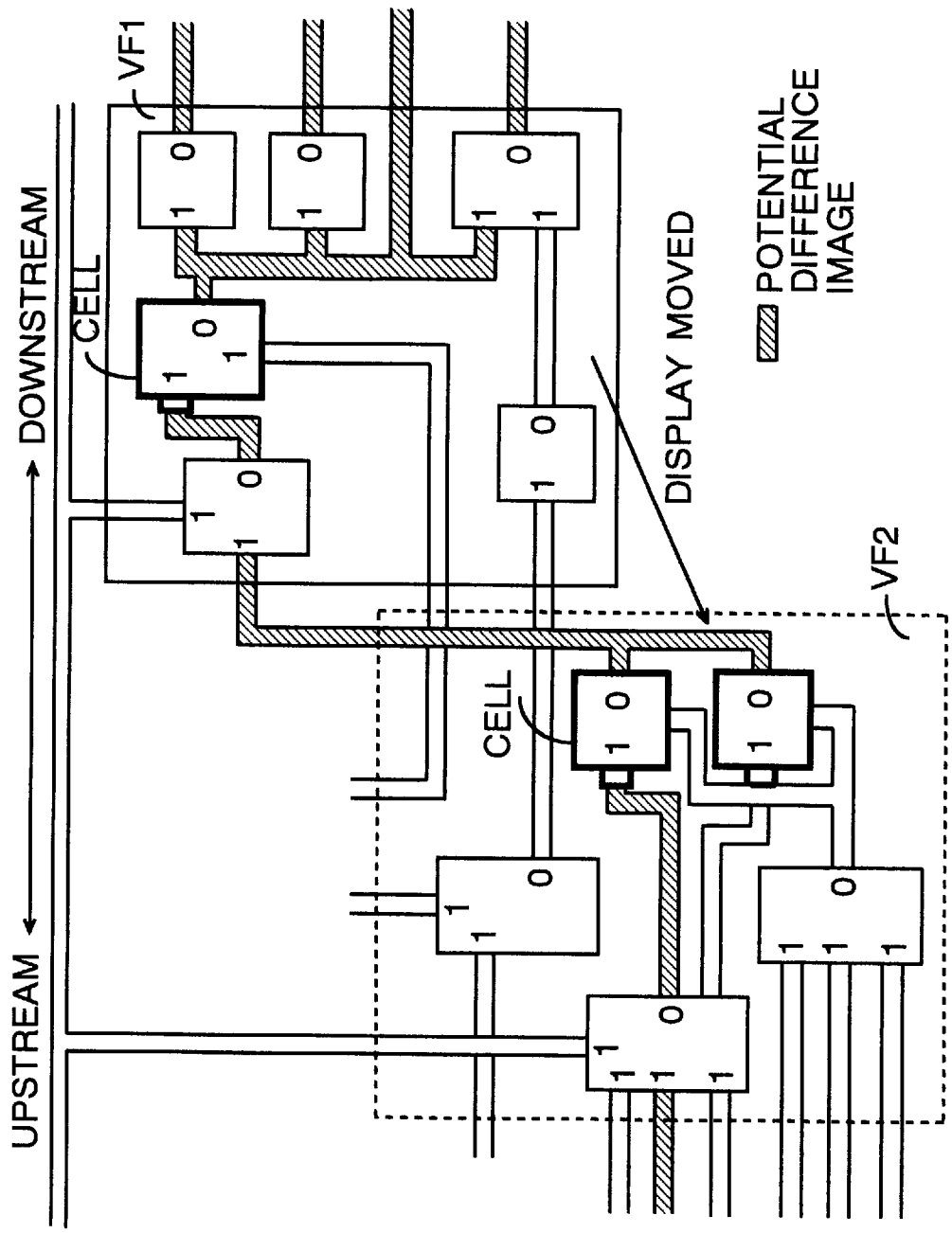

IC FAULT LOCATION TRACING APPARATUS AND METHOD

FIELD OF THE INVENTION

This invention relates to an IC fault location tracing apparatus and method for evaluating an IC device under test, and more particularly, to an IC fault location tracing apparatus and method using layout data produced in a CAD stage of the IC device to locate a defective portion of the IC device under test which is actually produced based on the CAD. The IC fault location tracing apparatus of the present invention is, in essence, based a combination of a semiconductor test system and a charged particle beam test system.

BACKGROUND OF THE INVENTION

In testing an IC device, it is known an apparatus and method of finding errors and tracing the physical positions of such errors in the IC device by a combination of a semiconductor IC tester and an electron beam tester. This invention is to improve the test efficiency and performance in the fault location tracing of the IC device using the combination of the semiconductor tester and the electron beam tester. Since the recent IC devices are designed through a computer aided design (CAD) process, the testing technology by the semiconductor tester and the electron beam tester tends to make full use of the CAD data produced in the design stage of the IC devices.

As is well known in the art, a semiconductor IC tester provides a test signal to corresponding pins of the IC device under test and compares the resulting output signal from the IC device with an expected value waveform. When the output signal does not agree with the expected value, the semiconductor test system determines that there is a fail in the IC device.

An electron beam tester (or a charged particle beam tester) emits an electron beam which scans a predetermined area of the IC device under test. The electron beam causes an emission of secondary electrons from the IC device under test, the amount of the secondary emission is dependent upon the electric potential of a circuit point of the IC device receiving the electron beam. The amount of the secondary electrons is measured in the form of an electric signal for every irradiation point of the IC device. Thus, the electron beam tester can reproduce an voltage waveform in the IC device based on the secondary electrons measured by the above process. The images reproduced through this process by the electron beam tester or other equivalent system is called a scanning electron microscope image (SEM image).

When a fault is found by the semiconductor IC tester as above, the IC tester repeatedly generates the same test pattern signal to the IC device. The electron beam tester then, with use of net data and layout data of the IC device produced in the CAD stage of the IC device, compares the voltage waveform of each location of the IC device under test, with the expected value waveform to find out the exact location of the fault in the IC device.

In the conventional technology, once a fault is found at an output terminal of the IC device by the semiconductor IC tester, a small portion of wiring pattern on the IC device is selected one by one by tracing the wiring pattern (sometimes called a net or a pattern/net) to an upper stream of a signal flow, toward a physical location of failure source by the electron beam tester.

For example, the following is a situation where an output level of an output pad A of the IC device is different from an expected value when a test pattern N is specified by the semiconductor IC tester. In the fault tracing operation, it is determined whether a wiring net waveform at the input of a gate which outputs the signal at the output pad A is normal or not. This determination is made by applying the test pattern N to the IC device and by comparing an expected value waveform with a waveform measured by the electron beam tester by actually driving the IC device. The expected value data for each wiring net, the input net of the gate in this case, is obtained through simulation of the IC device layout data produced in the CAD design of the IC device.

If the two waveforms do not match, a wiring net waveform at the input of another gate which outputs the signal at the previous wiring net, i.e., one step upper stream of the signal flow, is evaluated to determine whether the waveform at the wiring net matches with a corresponding expected value waveform produced by the CAD data.

Upon repetition of the above operation, each wiring net in the signal flow is traced back toward the upstream to focus the fault location of the IC device. If there is a coincidence between the waveforms in the above process, the further comparison of the two waveforms may be performed for a test pattern N-1 which is one pattern before the test pattern N. As a consequence, by tracing back the wiring nets and the test patterns toward the fault source (upper stream of the signal flow), the exact fault source in the circuit pattern of the IC device can be identified when the expected value by the CAD simulation matches the measured waveform by the electron beam tester.

There is another method of tracing the fault source by the electron beam tester. In this method, the electron beam tester measures an electric potential difference image showing potential differences between a good-conditioned state and a defected state of the IC device under test. In this case, in reference to the wiring pattern layout diagram based on the CAD layout data, the wiring patterns and the test patterns are further traced from the downstream of the output pad wherein an error is detected toward the upstream wherein the fault source is located, until the electric potential differences disappear in the image. If the electric potential difference images are completely disappeared, the fault source can be identified.

In the above-described conventional fault tracing method by using the measured waveforms, each waveform of the wiring net pattern is measured one by one by tracing the wiring nets in the IC device from the downstream to the upstream for comparing with an expected value waveform obtained through the CAD simulation. Thus, this conventional technology is disadvantageous because it takes too long a time, for instance, several days or several weeks to specify the faulty source in the circuit pattern of the IC device.

Moreover, in the other conventional fault tracing technology measuring the electric potential difference images, the wiring patterns to be traced are selected on a trial-and-error basis in reference to the wiring pattern layout diagram produced through the CAD data. Thus, this method is again disadvantageous because even if a person who is very skilled in the field of IC design and testing participates this operation, it takes a long time, for instance, several ten hours to several days to specify the faulty source.

SUMMARY OF THE INVENTION

It is an objective of the present invention to provide an IC fault location tracing apparatus and method in which a tracing and identification of failures of IC can be easily performed in a short period of time without requiring an user's knowledge of a net pattern layout of the IC device to be tested.

It is another object of the present invention to provide an IC fault location tracing apparatus and method which utilizing a combination of a semiconductor IC tester and a charged particle beam tester, such as an electron beam tester, and further utilizing CAD data produced in the design stage of the IC device under test to promote a high efficiency evaluation of the IC device.

It is a further object of the present invention to provide an IC fault location tracing apparatus and method which is capable of tracing back the net layout of the IC device under test by a unit of large block of net layout toward the upper stream of the signal flow in the IC device to determine the fault location.

In order to achieve the above objective, the IC fault location tracing apparatus in the present invention has the following structure.

Namely, the IC fault location tracing apparatus includes:
a semiconductor tester applying test patterns to terminals of IC device under test, generating an interruption in the charged particle beam tester as soon as a terminal showing an output signal different from the expected value is found while monitoring the outputs of the IC device, and sending a file log to the charged particle ray tester so as to notify a name of the faulty outside terminal;

a charged particle ray tester irradiating a charged particle beam originated from a trigger transmitted by the semiconductor tester to the IC device under test, measuring the amount of secondary electron generated from each radiation point per each radiation point, displaying an electron distribution in the IC device as potential contrast images by taking in said measured amount as electric signals, displaying electric potential difference images between a good-conditioned state and defected state of the IC device, and notifying the completion of image capturing and requesting changes in test patterns generation to the semiconductor tester for the next test; and a control device for instructing visual field data to the charged particle beam tester and extracting a potential difference image of the electric potential contrast images from the charged particle beam tester, wherein the control device stores net list data indicating input and output information of each circuit component of the IC device and mask layout data indicating pattern layout information of said IC device, and the control device instructs the charged particle beam tester to locate the fault position in the IC device by tracing back the circuit of the IC device by a visual field basis.

In the further aspect of the present invention, the control device in the IC fault location tracing apparatus is comprised of:
a fault-suspected layout pattern/net recognition means;
an output gate recognition means for a fault-suspected layout pattern;
an input net polygon recognition means recognizing wiring patterns corresponding to input net of said output gate of said fault-suspected layout pattern;
a visual field determination means determining next visual field data for tracing fault location;
a layout (visual field) display means instructing next layout (visual field) data to the charged particle ray tester;

a memory device storing net list data for executing the foregoing processes, net layout corresponding information, device-layout corresponding information, and layout data.

Further, it is also possible to provide a faulty outside terminal recognition means to which fail logs are inputted in the control device so that SEM (scanning electron microscope) images including failed pads in the IC device are automatically observed by using fail logs outputted from the semiconductor test system.

Furthermore, it is also possible to utilize a LSI tester as the semiconductor test system, as well as an EB tester as the charged particle beam tester. In addition, an electronic beam can be used as the charged particle ray.

Moreover, the following method is used as the IC fault location tracing method.

Namely, in the fault location tracing method of the present invention, with use of the net list data including a circuit connection and input/output relationship inside the DUT and device-layout corresponding information including the positioning relationship on the mask layout of a device such as a gate and cell, a location of a device at the side of the fault source which outputs an aimed failure wire pattern is automatically specified on the layout, and, in reference to this location, the fault is traced toward the fault source.

Moreover, in another method, with use of the net-layout corresponding information including the positioning relationship of the net included in the net list data on the mask layout, a net of the specified device at the input side is automatically specified on the layout, and, in reference to this net, the fault is traced toward the fault source.

Furthermore, layouts and SEM image vision fields are determined so as to include the specified device and nets. The external shape of the specified device is superdisplayed on the SEM images.

In the above-described IC fault location tracing apparatus and method, the specification of failure originated in the failed IC pads can be achieved efficiently in a short period of time. Furthermore, the fault locations of IC can be easily traced by a user without knowledge of the DUT design.

BRIEF DESCRIPTION OF THE DRAWINGS

FIG. 2 is a schematic showing a layout diagram of the present invention.

DETAILED DESCRIPTION OF THE PREFERRED EMBODIMENT

Figure 1:
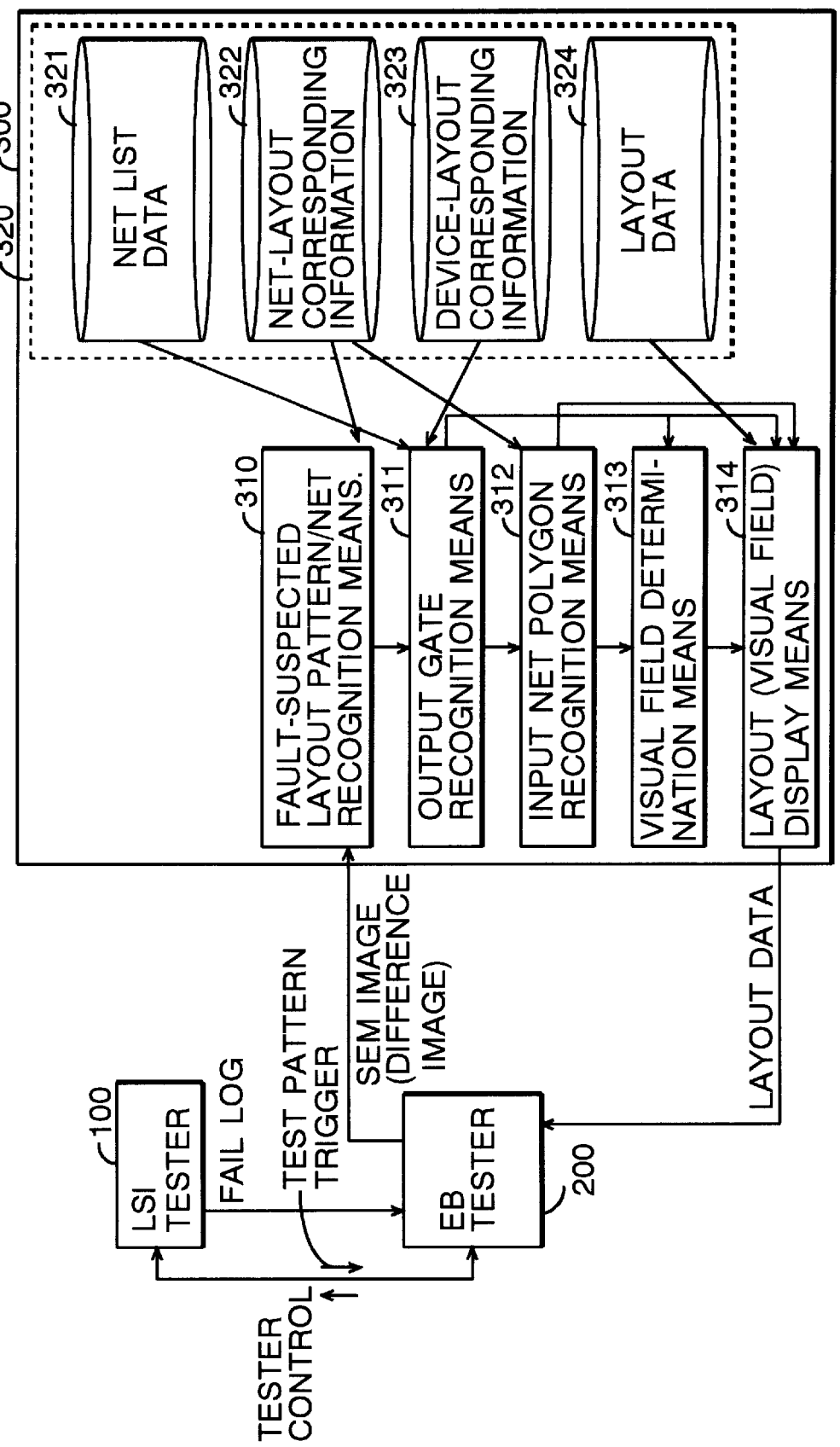
FIG. 1 is a block diagram showing the structure of the present invention.

FIG. 1 is a block diagram showing the structure of the present invention. The IC fault tracing apparatus includes a semiconductor IC (LSI) tester 100. The LSI tester 100 supplies test patterns to terminals (lead pins) of a semiconductor device under test (DUT) and monitors outputs of the DUT by comparing the outputs with expected value signals. If the LSI tester finds a terminal which is different from the expected value, it generates an interruption (trigger) signal to an electron beam (EB) tester. The LSI tester 100 further sends out fail logs (fail information) in order to notify the EB tester an identity of the faulty terminal of the DUT.

The IC fault tracing apparatus further includes the EB tester 200 which irradiates an scanning electron beam on the DUT initiated by the trigger signal transmitted by the LSI tester. The EB tester measures the amount of secondary electrons generated from each radiation point in response to the electron beam. The amount of secondary electrons is proportional to the voltage level of the radiation point of the circuit of the DUT.

Then the EB tester displays an electron distribution in the DUT as a potential contrast image by processing the measured secondary electrons as electric signals. The EB tester further displays an electric potential difference image which shows a potential difference between a good-conditioned state and defected state of the DUT. As is known in the art, these images are called SEM (scanning electron microscope) images. After obtaining the above images, the EB tester notifies the completion of the images and requests the LSI tester 100 to advance the test pattern.

The IC fault tracing apparatus further includes a control device 300 which defines visual field (monitor area) data and instructs the EB tester 200 to scan and display the visual field. The control device 300 receives the electric potential difference images which produced by the EB tester 200.

In the preferred embodiment, the control device 300 includes a fault-suspected layout pattern/net recognition means 310 which recognizes a pattern/net that is deemed to be highly related to the fault, and an output gate recognition means 311 which determines a gate generating an output connected to the fault-suspected layout pattern. The control device 300 further includes an input net polygon recognition means 312 which determines a wiring pattern corresponding to an input net of the gate which outputs the fault-suspected layout pattern, a visual field determination means 313 which determines data for the next visual field for tracing the fault location, and a layout (visual field) display means 314 which instructs the next layout (visual field) data to the EB tester 200.

For executing the above-described processes, a memory device 320 is provided in the control device 300. The memory device 320 stores net list data 321, net layout corresponding information 322, device-layout corresponding information 323, and layout data 324 therein.

Furthermore, it is also possible to provide a faulty outside terminal recognition means to which fail logs received from the LSI tester 100 are inputted in the control device 300 so that the SEM images including a fail pad (an internal circuit pad of the DUT which is closest to the fault terminal of the DUT) is automatically observed by using the fail logs.

FIG. 2 shows an example of the layout diagram of the DUT in which the electric potential difference images are measured. In the contrast image of FIG. 2, the dark pattern indicates that there is a potential difference between the expected data (good-condition state) obtained from the CAD data and the measured data (defective state) obtained by the EB tester. The overall layout diagram is formed based on the CAD data while the particular part of the layout diagram is monitored by the EB tester as will be described later. The operation of the fault location tracing apparatus of the present invention is explained in the following with reference to FIGS. 1 and 2.

First, with use of navigation CAD (Computer Aided Design) link software program (not shown) provided in the control device 300, the design data produced by CAD process is converted to the internal data base and stored in the memory device 320. The design data includes net list data showing the list of names and functions of all component in the circuit of the DUT and mask layout data showing the layout of circuit pattern in the DUT and LVS (layout versus schematic) data showing the relationship between the layout and circuit diagram of the DUT. Hereinafter, a "device" designates a cell or gate in the DUT.

After the above-described prior processes are done, the DUT is monitored by the EB tester 200. When monitoring the DUT by the EB tester, the SEM visual field of the EB tester 200 is set up so that SEM (Scanning Electron Microscope) images including pads (fault pads) inside chip connected to the fault-determined outside output terminals of the DUT based on the fail log report from the LSI tester 100 are observed. In this first stage, a positional adjustment for the SEM images at the side of the EB tester 200 and the layout diagram displayed by the layout display means is preferably performed.

Next, the EB tester 200 measures the potential difference image by measuring the potential difference of the net pattern of the SEM images between a good-conditioned state and defective condition of the DUT. In the example of FIG. 2, defective wiring patterns such as metallic wiring patterns connected to the fault pad is illustrated by the black lines.

Based on the metallic wiring patterns connected to the measured fault pad, the fault-suspected layout pattern/net recognition means 310 specifies the corresponding layout pattern and its net name by using the net-layout corresponding information 322.

Then, the output gate recognition means 311 utilizes the net name specified by the fault-suspected layout pattern/net recognition means 310 to determine the device name of a gate or sell in the upper stream of the circuit of the DUT by studying the net list data 321. The upper stream of the circuit is considered to be a direction toward the fault source of the DUT. In this case, the devices located in the upstream can be plural.

Based on the specified device name, the device-layout corresponding information 323 is investigated so as to specify the corresponding device layout. Further, based on the specified device name, the net list data 321 is searched so as to determine the input net name connected to the specified device as an input pattern.

If DUT is designed in a multi-layer structure, the device names can be specified in accordance with the multi-layer structure. In the example of FIGS. 1 and 2, such a purpose is accomplished by storing the layer information in the net list data 321.

Furthermore, the input net polygon recognition means 312 specifies a polygon near the device of the input layout pattern corresponding to the input net by searching the net-layout corresponding information 322 based on the input net name. Here, the "polygon" is a smallest unit for forming a layout pattern used in the CAD process. The polygon is usually a rectangular shaped unit indicating a part of layout pattern of the DUT circuit. Instead of using the polygon of the smallest segment of the pattern, a polygon showing an entire input layout pattern can also be adapted.

Based on the above-described result, the visual field determination means 313 determines the position and magnification os a visual field (monitor area) of the layout pattern so that the specified device and input layout pattern are included within the visual field. A layout diagram VF1 specified by the visual field is shown in the right side of FIG. 2.

The layout (visual field) display means 314 displays the layout diagram VF1 based on the data obtained by the visual field determination means 313 and notify the next tracing location by highlighting the specified device and polygon in the layout diagram VF1.

Further, the layout (visual field) display means 314 transmits the visual field information including position coordinates, the magnification of visual field to the EB tester 200. The information sent to the EB tester 200 may further includes position coordinates of the specified device such as each vertex coordinate of a rectangle of the device.

The EB tester 200 for example superdisplays the rectangle of the specified device so as to change the position of the SEM image corresponding to the visual field data and display the position of the specified device on the SEM image. Further, it is possible to superdisplay not only the outer shape of the device, but also the outer shape of the layout pattern of the specified input net corresponding to the device and lines, on the SEM image. In this arrangement, it is easy for a user to recognize the relationship between the two layout diagrams.

By the similar procedure above, it is possible to know the fault-suspected wiring pattern in the more upper stream location of the circuit pattern by observing the different images in the new visual field. In this example, the next layout diagram VF2 which is defined by the visual field determination means 313 and provided to the EB tester 200 through the layout (visual field) display means 314 is shown in the left side of FIG. 2 which is an upper stream of the signal flow in the DUT.

The above procedures are repeated until the wiring patterns of the different potential images do not appear in the EB tester 200. As has been foregoing, this method does not require to trace the wiring patterns one by one toward the upstream. In this method, it is possible to trace at once to the wiring pattern located in the most upstream position within the visual field. In other words, the tracing process in this invention is performed by a visual field by visual filed basis.

If it is still necessary to trace the test patterns again when the wiring patterns as the different images do not appear, one or more test cycles of the test patterns by the LSI tester are traced so as to detect the different image. Then, following the above-described procedure, the same procedures are repeated until the wiring patterns as the different images do not appear in the visual field. When tracing the wire nets and further test patterns toward the fault source and finding no wiring pattern as the different image, the fault source can be specified.

As in the foregoing, in the present invention, the tracing and location of the physical fault position in the DUT starting the fault pad within the DUT can be achieved in a short period of time since it is not necessary to advance in the upper stream by net by net basis. Furthermore, it does not require any knowledge for the user about the details of the DUT design to easily trace the fault location.

Although the present invention adapts the EB tester as the charged particle beam tester and LSI tester as the semiconductor tester, obviously, numerous variation and modification can be made without departing from the spirit of the present invention. Therefore, it is possible to utilize an ion beam tester as the charged particle beam tester in combination with a tester pattern generator as the semiconductor tester.

According to the present invention, it is possible to specify the exact fault location in the DUT in a very short period of time. It is very advantageous because a user without any knowledge about the DUT design can easily trace the fault location of the DUT.

What is claimed is:

1. An IC fault location tracing apparatus, comprising:
a semiconductor tester applying test patterns to terminals of an IC device under test, said semiconductor tester monitoring outputs of said IC device and providing an interruption signal to a charged particle beam tester as soon as a terminal of the IC device whose output disagrees with an expected value is found, said semiconductor tester sending file logs to said charged particle beam tester so as to notify an identity of said terminal which indicates said disagreement;

said charged particle beam tester scanning charged particle beam on said IC device when receiving said interruption signal from said semiconductor tester, said charged particle beam tester measuring an amount of secondary electrons generated from each point of said IC device which is radiated by said beam and displaying an electron distribution in said IC device as a potential contrast image by processing said amount of said secondary electrons, said charged particle beam tester displaying an electric potential difference image which indicates potential differences between a good-state and defected state of said IC device; and a control device for instructing visual field data to said charged particle beam tester and extracting a potential difference image of said electric potential contrast images from said charged particle beam tester, said control device storing net list data indicating input and output information of each circuit component of said IC device and mask layout data indicating pattern layout information of said IC device, said control device instructing said charged particle beam tester to locate the fault position in said IC device by tracing back the circuit of said IC device by visual field basis.

2. An IC fault location tracing apparatus as defined in claim 1, said control device comprising:
a fault-suspected layout pattern/net recognition means which for determining a layout pattern/net that is highly likely connected to a source of the fault of said IC device;

an output gate recognition means for determining a gate which is outputting a signal to said layout pattern/net suspected by said fault-suspect layout recognition means;

an input net polygon recognition means for recognizing wiring patterns corresponding to an input net which is an input layout pattern to said gate defined by said output gate recognition means;

a visual field determination means for determining a monitoring area by said charged particle beam tester for tracing the fault location in said IC device; and a visual field display means for instructing the next visual field data of an upper stream of signal flow in said IC device to said charged particle beam tester.

3. An IC fault location tracing apparatus as defined in claim 2, said control device further includes:
a memory device storing said net list data indicating input and output information of each circuit component of said IC device and said mask layout data indicating pattern layout information of said IC device and device-layout corresponding data, all of said data are derived through a computer aided design (CAD) stage of said IC device.

4. An IC fault location tracing apparatus as defined in claim 1, said charge particle beam tester notifies said semiconductor tester when said images have been obtained in said beam tester and requests said semiconductor tester to generate the next test pattern to be supplied to said IC device.

5. An IC fault location tracing apparatus of claim 1, further comprising: a faulty outside terminal recognition means provided in said control device to which fail logs are inputted so that said images including failed pads are automatically observed by using fail logs outputted from the semiconductor test system.

6. An IC fault location tracing apparatus of claim 1, wherein a large scale integrated circuit (LSI) tester is used as the semiconductor test system, and an electron beam tester is used as the charged particle beam tester.

7. An IC fault location tracing apparatus of claim 1, further characterized in that: with use of said net list data including a circuit connection and input/output relationship inside the DUT and device-layout corresponding data including the positioning relationship on the mask layout of a device such as a gate and cell, a location of a device at the side of the fault source which outputs an aimed failure wire pattern is automatically specified on the layout and, in reference to this location, the fault is traced toward the fault source.

8. An IC fault location tracing apparatus of claim 7, further characterized in that: with use of said net-layout corresponding data including the positioning relationship of the net included in said net list data on the mask layout, a net of the specified device at the input side is automatically specified on the layout, and, in reference to this net, the fault is traced toward the fault source.

9. An IC fault location tracing apparatus of claim 7, wherein layouts and image visual fields are determined so as to include the specified device and nets in said visual field.

10. An IC fault location tracing apparatus of claim 7, wherein the external shape of the specified device is super-displayed on the images.

* * * * *